United States Patent [19]

Ooyama et al.

[11] Patent Number: 4,758,973
[45] Date of Patent: Jul. 19, 1988

[54] APPARATUS FOR PROCESSING FLOATING-POINT DATA HAVING EXPONENTS OF A VARIABLE LENGTH

[75] Inventors: Mitsuo Ooyama, Hachioji; Hozumi Hamada, Tokyo; Kimiaki Ando, Ome, all of Japan

[73] Assignee: Hitachi, Ltd., Tokyo, Japan

[21] Appl. No.: 772,696

[22] Filed: Sep. 5, 1985

[30] Foreign Application Priority Data

Sep. 5, 1984 [JP] Japan ................................. 59-184625

[51] Int. Cl.⁴ .......................... G06F 7/48; G06F 5/00
[52] U.S. Cl. .................................... 364/748; 235/310
[58] Field of Search .................. 364/748; 235/310; 340/347 DD

[56] References Cited

U.S. PATENT DOCUMENTS 3,742,198  6/1973  Morris ................................. 235/310
4,617,641  10/1986  Hamada ............................. 364/748
4,675,809  6/1987  Omoda et al. ...................... 364/748

OTHER PUBLICATIONS

Morris, "Tapered Floating Point: A New Floating-Point Representation", IEEE Trans. on Computers, Dec. 1971, pp. 1578-1579.
Matsui et al., "An Overflow/Underflow-Free Floating-Point Representation of Numbers", J. of Infor. Processing, vol. 4, No. 3, 1981, pp. 123-133.

Patent Abstracts of Japan, vol 8, No 101, p. P-273 [1538], May 12, 1984; (JP-A-59 11 444, Jan. 21, 1984).

Primary Examiner—Gary V. Harkcom
Assistant Examiner—Tan V. Mai
Attorney, Agent, or Firm—Antonelli, Terry & Wands

[57] ABSTRACT

A floating-point data processing apparatus operates to generate exponent data of fixed length from floating-point data composed of (a) a sign bit indicating a mantissa sign, (b) a first exponent part which has bit length determined in dependence upon a significant bit length necessary for binary expression of an exponent and which has all its bits determined at 1 or 0 in dependence upon the mantissa sign and the sign of said exponent, (c) a second exponent part which has its bit length determined in dependence upon the bit length of the first exponent part, which has a predetermined relationship determined in dependence upon the sign of the exponent and the mantissa sign with the significant bit part when the exponent is expressed in binary form, and the leading bit of which has a value different from the value of one bit of said first exponent part, and (d) a mantisa part which has a plurality of bits having a bit length determined in dependence upon the value of the exponent. The exponent data of fixed length is composed of a sign bit part having a plurality of bits having values indicating the sign of the exponent and a significant bit part having a plurality of bits indicating the values of the exponent.

6 Claims, 15 Drawing Sheets

FIG. 5

| INPUTS | | | | | OUTPUTS | | |
|---|---|---|---|---|---|---|---|
| REFE-RENCE BIT 120 | PARTIAL BIT SERIES BIT NUMBER 121-i | | | | FLAG 122-i | NUMBER INVERTED BIT 123-i | |
| | 3 | 2 | 1 | 0 | | | |
| 0 | 0 | 0 | 0 | 0 | 0 | X | X |
| 0 | 0 | 0 | 0 | 1 | 1 | 0 | 0 |
| 0 | 0 | 0 | 1 | X | 1 | 0 | 1 |
| 0 | 0 | 1 | X | X | 1 | 1 | 0 |
| 0 | 1 | X | X | X | 1 | 1 | 1 |
| 1 | 0 | X | X | X | 1 | 1 | 1 |
| 1 | 1 | 0 | X | X | 1 | 1 | 0 |
| 1 | 1 | 1 | 0 | X | 1 | 0 | 1 |
| 1 | 1 | 1 | 1 | 0 | 1 | 0 | 0 |
| 1 | 1 | 1 | 1 | 1 | 0 | X | X |

FIG. 6

| INPUTS | | OUTPUTS | |
|---|---|---|---|
| 123-2 | 123-1 | FLAG 125 | PARTIAL BIT SERIES CHECK CKT NUMBER 124 |
| 0 | 0 | 1 | X |
| 0 | 1 | 0 | 0 |
| 1 | X | 0 | 1 |

FIG. 8

| INPUT DATA 100 | | | | | | | | OUTPUTS 101 | | | |
|---|---|---|---|---|---|---|---|---|---|---|---|
| | | | | | | | | 119 | 120 | 127 | 128 |
| 0 | 0 | 0 | 0 | 0 | 0 | 0 | 0 | 0 | 0 | 1 | 1 1 |
| 0 | 0 | 0 | 0 | 0 | 0 | 0 | 1 | 0 | 0 | 0 | 0 0 |
| 0 | 0 | 0 | 0 | 0 | 0 | 1 | × | 0 | 0 | 0 | 0 1 |
| 0 | 0 | 0 | 0 | 0 | 1 | × | × | 0 | 0 | 0 | 1 0 |
| 0 | 0 | 0 | 0 | 1 | × | × | × | 0 | 0 | 0 | 1 1 |
| 0 | 0 | 0 | 1 | × | × | × | × | 0 | 0 | 1 | 0 0 |
| 0 | 0 | 1 | × | × | × | × | × | 0 | 0 | 1 | 0 1 |
| 0 | 1 | 0 | × | × | × | × | × | 0 | 1 | 1 | 0 1 |
| 0 | 1 | 1 | 0 | × | × | × | × | 0 | 1 | 1 | 0 0 |
| 0 | 1 | 1 | 1 | 0 | × | × | × | 0 | 1 | 0 | 1 1 |
| 0 | 1 | 1 | 1 | 1 | 0 | × | × | 0 | 1 | 0 | 1 0 |
| 0 | 1 | 1 | 1 | 1 | 1 | 0 | × | 0 | 1 | 0 | 0 1 |
| 0 | 1 | 1 | 1 | 1 | 1 | 1 | 0 | 0 | 1 | 0 | 0 0 |
| 0 | 1 | 1 | 1 | 1 | 1 | 1 | 1 | 0 | 1 | 1 | 1 1 |
| 1 | 0 | 0 | 0 | 0 | 0 | 0 | 0 | 1 | 0 | 1 | 1 1 |
| 1 | 0 | 0 | 0 | 0 | 0 | 0 | 1 | 1 | 0 | 0 | 0 0 |
| 1 | 0 | 0 | 0 | 0 | 0 | 1 | × | 1 | 0 | 0 | 0 1 |
| 1 | 0 | 0 | 0 | 0 | 1 | × | × | 1 | 0 | 0 | 1 0 |
| 1 | 0 | 0 | 0 | 1 | × | × | × | 1 | 0 | 0 | 1 1 |
| 1 | 0 | 0 | 1 | × | × | × | × | 1 | 0 | 1 | 0 0 |
| 1 | 0 | 1 | × | × | × | × | × | 1 | 0 | 1 | 0 1 |
| 1 | 1 | 0 | × | × | × | × | × | 1 | 1 | 1 | 0 1 |
| 1 | 1 | 1 | 0 | × | × | × | × | 1 | 1 | 1 | 0 0 |
| 1 | 1 | 1 | 1 | 0 | × | × | × | 1 | 1 | 0 | 1 1 |
| 1 | 1 | 1 | 1 | 1 | 0 | × | × | 1 | 1 | 0 | 1 0 |
| 1 | 1 | 1 | 1 | 1 | 1 | 0 | × | 1 | 1 | 0 | 0 1 |
| 1 | 1 | 1 | 1 | 1 | 1 | 1 | 0 | 1 | 1 | 0 | 0 0 |
| 1 | 1 | 1 | 1 | 1 | 1 | 1 | 1 | 1 | 1 | 1 | 1 1 |

FIG. 10A

| | 1 | 2 | 3 | |
|---|---|---|---|---|
| 0 ···· 0 | 0 | 1 ···· 1 | 0 $e_{m-1}$ ··· $e_1$ | ~103 |
| 0 ···· 0 | 0 | 1 ···· 1 | 1 0 ···· 0 | ~102 |
| 0 ···· 0 | 0 | 0 ···· 0 | 1 $e_{m-1}$ ··· $e_1$ | ~105 |
| $\ell-(2m+2)$ | 1 | m+1 | m | |
| $\ell$ | | | | |

FIG. 10B

| 0 ···· 0 | 0 | 0 ···· 0 | 1 $e_{m-1}$ ··· $e_1$ | ~103 |
|---|---|---|---|---|
| 1 ···· 1 | 1 | 1 ···· 1 | 1 0 ···· 0 | ~102 |
| 1 ···· 1 | 1 | 1 ···· 1 | 0 $e_{m-1}$ ··· $e_1$ | ~105 |

FIG. 10C

| 0 ···· 0 | 1 | 0 ···· 0 | 1 $\overline{e_{m-1}}$ ··· $\overline{e_1}$ | ~103 |
|---|---|---|---|---|
| 0 ···· 0 | 1 | 0 ···· 0 | 0 1 ···· 1 | ~102 |
| 0 ···· 0 | 0 | 0 ···· 0 | 1 $e_{m-1}$ ··· $e_1$ | ~105 |

FIG. 10D

| 0 ···· 0 | 1 | 1 ···· 1 | 0 $\overline{e_{m-1}}$ ··· $\overline{e_1}$ | ~103 |
|---|---|---|---|---|
| 1 ···· 1 | 0 | 0 ···· 0 | 0 1 ···· 1 | ~102 |
| 1 ···· 1 | 1 | 1 ···· 1 | 0 $e_{m-1}$ ··· $e_1$ | ~105 |

FIG. 10E

| | | |
|---|---|---|
| 1 ⋯ 1 | 0 $e_{m-1}$ ⋯ $e_{2m+3-\ell}$ | 0 ⋯ 0 | ← 103
| 1 ⋯ 1 | 1 0 ⋯ 0 | 0 ⋯ 0 | ← 102
| 0 ⋯ 0 | 1 $e_{m-1}$ ⋯ $e_{2m+3-\ell}$ | 0 ⋯ 0 | ← 105

$\underbrace{\phantom{xxx}}_{\ell-m}$ $\underbrace{\phantom{xxxxx}}_{\ell-m-2}$ $\underbrace{\phantom{xxx}}_{2m+2-\ell}$
$\underbrace{\phantom{xxxxxxxxxxxxx}}_{\ell}$

FIG. 10F

| 0 ⋯ 0 | 1 $e_{m-1}$ ⋯ $e_{2m+3-\ell}$ | 0 ⋯ 0 |
| 1 ⋯ 1 | 1 0 ⋯ 0 | 0 ⋯ 0 |
| 1 ⋯ 1 | 0 $e_{m-1}$ ⋯ $e_{2m+3-\ell}$ | 0 ⋯ 0 |

FIG. 10G

| 0 ⋯ 0 | 1 $\overline{e_{m-1}}$ ⋯ $\overline{e_{2m+3-\ell}}$ | 0 ⋯ 0 |
| 0 ⋯ 0 | 0 1 ⋯ 1 | 0 ⋯ 0 |
| 0 ⋯ 0 | 1 $e_{m-1}$ ⋯ $e_{2m+3-\ell}$ | 0 ⋯ 0 |

FIG. 10H

| 1 ⋯ 1 | 0 $\overline{e_{m-1}}$ ⋯ $\overline{e_{2m+3-\ell}}$ | 0 ⋯ 0 |
| 0 ⋯ 0 | 0 1 ⋯ 1 | 0 ⋯ 0 |
| 1 ⋯ 1 | 0 $e_{m-1}$ ⋯ $e_{2m+3-\ell}$ | 0 ⋯ 0 |

FIG. 15A

| | 7 | 10 | 3 | | |
|---|---|---|---|---|---|
| 0 | 0······0 | 1 $e_{m-1}$··$e_1$ | 0···0 | ←114 |
| 0 | 1····1 | 1 0···0 | 0···0 | ←112 |
| 0 | 1····1 | 0 $e_{m-1}$··$e_1$ | 0···0 | ←116 |

| m+1 | m | ℓ−2m−2 |
|---|---|---|

| 1 | 1····1 | 0 $e_{m-1}$··$e_1$ | 0···0 | ←114 |
|---|---|---|---|---|
| 1 | 1····1 | 1 0···0 | 0···0 | ←112 |
| 0 | 0····0 | 1 $e_{m-1}$··$e_1$ | 0···0 | ←116 |

FIG. 15C

| 0 | 0····0 | 1 $e_{m-1}$··$e_1$ | 0···0 | ←114 |
|---|---|---|---|---|
| 0 | 0····0 | 0 1···1 | 0···0 | ←112 |
| 0 | 0····0 | 1 $\overline{e_{m-1}}$··$\overline{e_1}$ | 0···0 | ←116 |

FIG. 15D

| 1 | 1····1 | 0 $e_{m-1}$··$e_1$ | 0···0 | ←114 |
|---|---|---|---|---|
| 1 | 0····0 | 0 1···1 | 0···0 | ←112 |
| 0 | 1····1 | 0 $\overline{e_{m-1}}$··$\overline{e_1}$ | 0···0 | ←116 |

FIG. 15E

| | 7 | 10 | 5 | 3 | |
|---|---|---|---|---|---|
| | 0 | 0 · · · · · · · 0 | 1 | $e_{m-1}$ · · · | ←114 |
| | 0 | 1 · · · · · · · 1 | 1 0 · · · · | | ←112 |
| | 0 | 1 · · · · · · · 1 | 0 $e_{m-1}$ · · · | | ←116 |

$\leftarrow m+1 \rightarrow | \leftarrow m \rightarrow$
$\leftarrow \ell \rightarrow$

FIG. 15F

| 1 | 1 · · · · · · · 1 | 0 $e_{m-1}$ · · · | ←114 |
|---|---|---|---|
| 1 | 1 · · · · · · · 1 | 1 0 · · · · | ←112 |
| 0 | 0 · · · · · · · 0 | 1 $e_{m-1}$ · · · | ←116 |

FIG. 15G

| 0 | 0 · · · · · · · 0 | 1 $e_{m-1}$ · · · | ←114 |
|---|---|---|---|
| 0 | 0 · · · · · · · 0 | 0 1 · · · · | ←112 |
| 0 | 0 · · · · · · · 0 | 1 $\overline{e_{m-1}}$ · · · | ←116 |

FIG. 15H

| 1 | 1 · · · · · · · 1 | 0 $e_{m-1}$ · · · | ←114 |
|---|---|---|---|
| 1 | 0 · · · · · · · 0 | 0 1 · · · · | ←112 |
| 0 | 1 · · · · · · · 1 | 0 $\overline{e_{m-1}}$ · · · | ←116 | apparatus for processing
floating-point data having exponents
of a variable length

BACKGROUND OF THE INVENTION

The present invention relates to an apparatus for processing floating-point data having exponents of a variable length.

The format of the floating-point data having exponents of variable length to be processed by the present invention is known in Japanese Patent Laid-Open No. 59-11444 or U.S. Pat. No. 4,617,641. In order to process such floating-point data, it is necessary to separate the exponents and the mantissa from the data before processing and to generate floating-point data having exponents of variable length by combining the exponent and mantissa data both of fixed length obtained as a result of the processing.

In the above-referenced U.S. Pat. No. 4,617,641, however, the separating and combining processings are executed in a bit-serial manner which results in a lower processing rate.

SUMMARY OF THE INVENTION

An object of the present invention is to provide an apparatus which can separate or combine floating-point data having exponent parts of variable length in a bit-parallel manner.

According to a feature of the present invention, there is provided a floating-point data processing apparatus for generating exponent data of fixed length from floating-point data which is composed of a sign bit indicating the sign of the mantissa; a first exponent part which has a bit length determined in dependence upon the significant bit length necessary for expressing an exponent in binary form and which has all of its bits determined at 1 or 0 in dependence upon the mantissa signal and the sign of the exponents; a second exponent part which has its bit length determined in dependence upon the bit length of the first exponent part, which has a predetermined relationship determined in dependence upon the sign of the exponent and the mantissa sign with the significant bit part when the exponent is expressed in binary form, and the leading bit of which has a value different from the value of one bit of the first exponent part; and a mantissa part which has a plurality of bits having a bit length determined in dependence upon the value of the exponent. The exponent data of fixed length is composed of a sign bit part having a plurality of bits having values indicating the sign of the exponent; and a significant bit part having a plurality of bits indicating the values of the exponent. The apparatus comprises: a detect circuit for receiving in parallel a plurality of bits other than the sign bit of the floating-point data and for detecting the position of a bit, which has a value different from the value of one bit of the first exponent part and which is the closest to said first exponent part, as the position of the leading bit of the second exponent part, a shift circuit for receiving in parallel at least the bits other than the code bit of the floating-point data and responsive to the position detected by the detect circuit, for shifting the floating-point data such that the second exponent part comes to a predetermined position; a signal circuit for generating a bit pattern indicating the bit position of the shifted floating-point data which has its value to be transformed in dependence upon the sign bit of the floating point data, the leading bit of the first exponent part and an the detected position; and output circuit for receiving in parallel the respective bits of the floating-point data shifted by the shift circuit and the generated bit patterns and for generating exponent data.

According to another feature of the present invention, there is provided a floating-point data processing apparatus for generating floating-point data having an exponent part of a varying length from both exponent data of fixed length and mantissa data of fixed length, the exponent data being composed of a sign bit part having a plurality of bits having values determined by an exponent sign and a significant bit part having a plurality of bits indicating the value of the exponent, and the mantissa data of fixed length being composed of a mantissa sign bit part, an inverted bit part inverted from the mantissa bit part, and a mantissa significant bit part, the floating-point data being composed of: a sign bit indicating a mantissa sign; a first exponent part bit length determined in dependence upon a significant bit length necessary for expressing an exponent in binary form and which has all its bits determined at 1 or 0 in dependence upon the mantissa sign and the sign of the exponent; a second exponent part which has its bit length determined in dependence upon the bit length of said first exponent part, which has a predetermined relationship determined in dependence upon the sign of the exponent and the mantissa sign with the significant bit part when the exponent is binarily expressed, and the leading bit of which has a value different from the value of one bit of the first exponent part, and a mantissa part which has a plurality of bits having values determined in dependence upon the value of the exponent. The apparatus has a detect circuit for receiving in parallel a plurality of bits of the exponent data and for detecting the position of a bit, which has a value different from the value of one bit of the sign bit part and which is the closest to the sign bit part, as the position of the leading bit of the significant bit part; a first shift circuit for receiving in parallel a plurality of bits of the exponent data and for shifting the exponent data in dependence upon the detected position such that the leading bit of the exponent data is positioned next to the first exponent part of the floating-point data to be generated; a second shift circuit for receiving in parallel a plurality of the mantissa data for shifting the mantissa data in dependence upon the detected position such that the leading bit of said mantissa data comes next to the significant bit part of the exponent data after being shifted; a signal circuit for generating both a first bit pattern which indicates the bit position of a bit, which has a value to be transformed, of the exponent data, which are shifted by the first shift circuit, in dependence upon one of the sign bit part of the exponent data, the sign bit of the mantissa bit and the detected position and for generating a second bit pattern which indicates the position other than the mantissa significant bit part of the mantissa data shifted by the second shift circuit, in dependence upon the detected position; and an output circuit for receiving in parallel both the respective bits of the exponent data and the mantissa data, after being shifted respectively by the first and second shift means, and the respective bits of the first and second bit patterns and for generating the floating-point data.

BRIEF DESCRIPTION OF THE DRAWINGS

FIG. 5 is a diagram showing the input and output relationship of a partial bit train check circuit (34-i) of FIG. 4;

FIG. 6 is a diagram showing the input and output relationship of a priority encoder (35) of FIG. 4;

FIG. 8 is a diagram showing an example of the boundary recognition result of FIG. 4;

FIGS. 10A to 10H are diagrams for explaining the output bit patterns of a bit pattern generator (21);

FIGS. 15A to 15H are diagrams for explaining the output bit patterns (112) of a bit pattern generator (28) of FIG. 3;

DESCRIPTION OF THE PREFERRED EMBODIMENT

Figure 1:
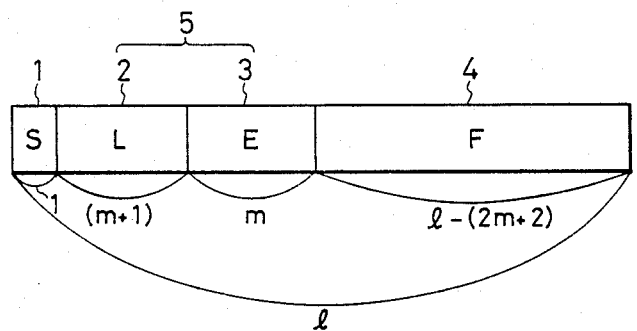
FIG. 1 is a diagram showing the format of the floating-point data having exponent parts of varying length, which are to be used in the present invention.

Before entering into the specific description of the floating-point processing apparatus according to the present invention, a cursory review will be made in the following as to the system for expressing floating-point data having an exponent part of variable length (which system will be shortly referred to as the "present expression" or the "present expression method") which is to be used in the processing apparatus of the present invention.

The essence of the present expression method resides in the fact that the length of an exponent part is determined in dependence upon the preceding "0" train or "1" train thereof. The present expression method will be described specifically in the following examples.

1. In the present expression, the number 0 and the infinity can be expressed, as follows:

0: "000,---, 0" and

Infinity: "100,---, 0"

Next the number other than the above two will be described in the following:

2. A number to be expressed is designated at x and is expressed by a multiple of two numbers e and f, as follows:

$$x = 2^3 f \quad (1).$$

Here, in order to make the value univalent, the numbers e and f are conditioned, as follows: The first consideration is limited to the case of x>0:

$$e: \text{Integer} \quad (2);$$

and $$1 \leq f < 2 \quad (3).$$

Next the following three data are provided as the expression method in the specified order.

(i) Sign bit (1 bit expressing the sign of the number x);

(ii) Exponent Part; and (iii) Mantissa Part.

The binary expression of the value of the mantissa f is as follows:

$$f = 1. f_1 f_2 f_3 \quad (4).$$

At this time, the term $f_1 f_2 f_3$ is assumed to be the bit pattern of the mantissa part. Aiming at making the exponent part variable, the following method is used to give a self-describing ability to the length of the variable length data field. The following expression is to be used because the double exponent expression will frequently be used:

$$2^n \rightarrow \exp(n) \quad (5).$$

For e>0, the range in which the number e can be expressed just by a binary m (>0) bits is as follows:

$$2^{m-1} \leq e < 2^m - 1 \quad (6).$$

If the range of the number f of Equation (3) is incorporated, Equation (6) is expressed in terms of the range of the number x, as follows:

$$\exp(2^{m-1}) \leq x \leq \exp(2^m) \quad (7)$$

for $e<0$, considering the symmetry with Equation (7), another expression is obtained:

$$\exp(-2^m) \leq x < \exp(-2^{m-1}) \quad (8)$$

If this expression is returned to the range of the number e, the following expression is obtained:

$$-2^m \leq e < -2^{m-1} - 1 \quad (9)$$

From Equation (9), it is rational that the expression of the number e is an expression in 2's compliment. Therefore, the following expression of the mantissa f is rational for $x<0$:

$$-2 \leq x < -1 \quad (3')$$

Equations (6) and (9) do not contain the cases of $e=0$ and $-1$. This is interpreted as $m=0$. Including these, the internal expression of the integer e in case this number e can be expressed just by the m bits, is as follows:

$m+1$ $$\text{for } e \geq 0: 0, \ldots, \overbrace{0\ 1\ e_{m-1}, \ldots, e_2\ e_1}^{m+1}; \quad (10)$$

and $$e < 0: 1, \ldots, 1\ 0\ e_{m-1}, \ldots, e_2\ e_1.$$

From the values $e_{m-1}, ---, e_2\ e_1$ and m, the exponent part is prepared by arranging the "1" or "0" train of $(m+1)$ figures in accordance with the code of the exponent e, by arranging the "0" or "1" train after the former train, and by subsequently arranging the value $e_{m-1}, ---, e_2\ e_1$ as follows:

$$\text{"for } e \geq 0: \overbrace{1, \ldots, 10}^{m+1}\ \overbrace{e_{m-1}, \ldots, e_2\ e_1;}^{m-1}\text{"} \quad (11)$$

and

"for $e < 0: 0, \ldots, 1\ e_{m-1}, \ldots, e_2\ e_1$.

The length of the exponent part is expressed by $(2m+1)$ and is characterized by the fact that it increases as the magnitude of the exponent increases. The length of the exponent part is also characterized by the fact that it can be detected easily by detecting the length $m+1$ of the "1" or "0" train positioned at the leading part.

The order of the magnitude of the part except the leading "1" or "0" train of Equation (11) is coincident with the order of magnitude of the value e even if the mantissa part is included in the consideration.

For $x<0$ like the case of $x>0$, Equation (7) is replaced by the following equation:

$$-\exp(2^m) \leq x < -\exp(2^{m-1}) \quad (7')$$

and Equation (8) is replaced by the following equation:

$$-\exp(2^{m-1}) \leq x < -\exp(2^m) \quad (8')$$

For $x<0$, the order of Equation (11) may be reversed by considering that the order of the value x and the order of the value e are reversed, and this reversal can be made by taking the complementary number of 1. Hence, Equations (11) are replaced by the following equations:

$$\text{for } e > 0: \overbrace{0, \ldots, 0\ 1}^{m+1}\ \overbrace{\overline{e_{m-1}} \ldots \overline{e_2}\ \overline{e_1}}^{m} \quad (11')$$

In dependence upon the sign of the exponent e, the sequence of the $(m+1)$ number of "0" or "1" is followed by the "1" or "0" sequence and then by the respective inverted bits $\overline{e_{m-1}}, ---, \overline{e_1}$, of the bits $e_{m-1}, ---, e_1$. This expression also has the characteristics described in connection with Equation (11).

FIG. 1 shows the general format of the number according to the present expression. Indicated at numeral 1 is the sign bit of a mantissa which takes the value "0" or "1" in accordance with the positive or negative characteristic of the number x. Indicated at numeral 5 is an exponent part which is expressed by Equation (11) or (11'). An L field 2 is a part of the "1" sequence or "0" sequence of $(m+1)$ bits, and an E field 3 is a significant bit part composed of m bits and expressing the magnitude of the exponent. An F field 4 is a mantissa part which is composed of $1-(2+2)$ bits if the total part number of the expression of FIG. 1 is designated by l.

Since the number $[100]_{10}$ is expressed by Equation (1) as follows:

$$2^6 \times (25/16),$$

the mantissa f is expressed by Equation (4), as follows:

$$f = [1.10010---]_2.$$

Since $e=6$, moreover, $m=3$ so that the exponent part is expressed by Equation (11), as follows:

$$\left[\overbrace{1\ 1\ 1\ 1}^{4}\ 0\ 1\ 0\right]_2.$$

Figure 2:
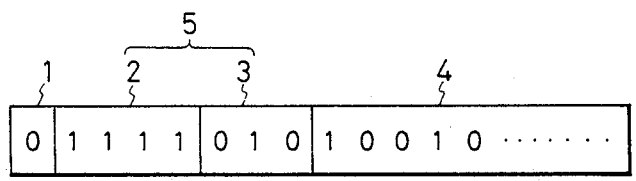
FIG. 2 is a diagram showing the data of a number $100_{10}$ according to the expression of FIG. 1.

Hence, the number $[100]_{10}$ is expressed, as shown in FIG. 2, according to the present expression, as follows:

$$x_{100} = \underbrace{0}_{S}\ \underbrace{1\ 1\ 1\ 10}_{L}\ \underbrace{1\ 01}_{E}\ \underbrace{0\ 0\ 1\ 0}_{F}\ .$$

In order to conduct floating-point processing of the numerical data which is expressed by using the exponent part 5 of variable length shown in FIG. 1, as is apparent from the description provided thus far, it is necessary to separate the exponent part data having the exponent part of fixed length of the prior art and the remaining mantissa part data. For this purpose, it is necessary to separate the exponent part 5 and the mantissa part 4, which have the expression of FIG. 1. Thus, it is sufficient to detect the length of the L field 2 to determine $m+1$. As is apparent from Equation (11) or (11'), the leading bit of the E field takes the value reversed from the value "1" or "0" forming the bit sequence of the L field 2. By making use of these characteristics, it is possible to detect the length m+1 of the L field 2 and to find the boundary between the E field 3 and the F field 4 on the basis of the length m+1 detected. As is apparent from Equation (11), in case the sign bit S is 0, the E field 3 expresses the exponent as it is when the L field 2 is a bit sequence of "1", and the reversed E field 3 expresses the exponent when the sign bit S is "1".

In the practical processing apparatus, there is a limit to the total length of the data of FIG. 1. At this time, the bit in the allowable data length is selected to be the exponentially expressed data of variable length from the S field 1 of the data of FIG. 1. As a result, when the exponent is large, the data may not contain the mantissa part 4 or a part of the E field 3. However, this case raises no problem in the present expression.

Figure 3:
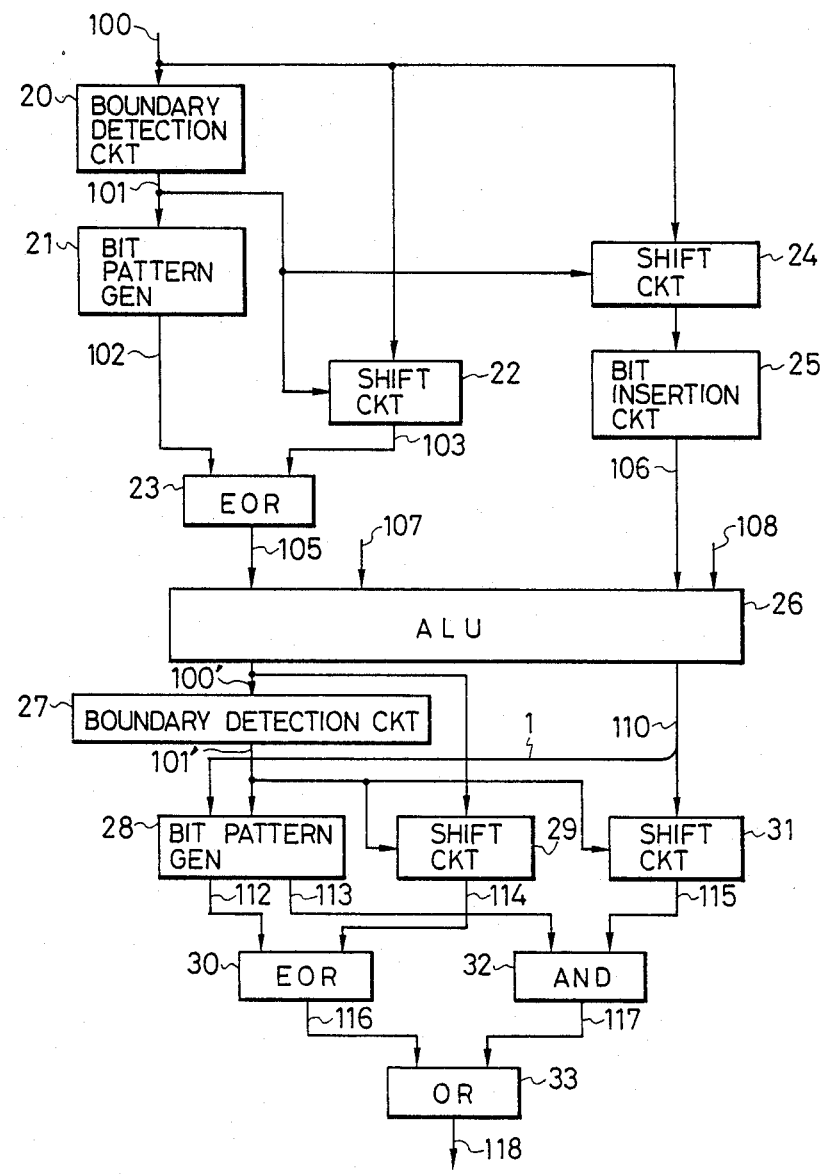
FIG. 3 is a block diagram showing the floating-point data processing apparatus according to one embodiment of the present invention.

FIG. 3 is a block diagram showing one embodiment of the present invention. In FIG. 3, reference numeral 20 indicates a boundary detection circuit for detecting the boundary between the length description part 2 and the signficant bit part 3 of the exponent part; numerals 21 and 28 designate bit pattern generators; numerals 22, 24, 29, and 31 identify shift circuits for shifting input bits in parallel; numerals 23 and 30 indicate exclusive OR circuits; numeral 25 identifies a bit insertion circuit, numeral 26 indicates an arithmetic logic unit for processing floating-point data having an exponent part of fixed length; numeral 27 represents a boundary detection circuit for detecting the boundary between the exponent sign bit part and the significant bit part; numeral 32 indicates an AND circuit; and numeral 33 indicates an OR circuit.

In FIG. 3, the arithmetic processing of the data 100 of the exponent of variable length according to the present expression is conducted, as follows:

(1) Detection of the boundary between the length description part 2 and the signficant bit part 3 of the exponent part 5;

(2) Separation of the exponent part 5 and the mantissa part 4;

(3) Arithmetic operation on the separated exponent part and mantissa part to provide resultant floating point data with an exponent part of a fixed length and a normalizing mantissa part;

(4) Detection of the boundary between the sign bit part and the significant bit part of the exponent of the resultant floating point data; and (5) Combining of the exponent part and the mantissa part of the resultant floating point data to provide floating point data with an exponent part of variable length.

The processing itemized above will be described in detail in the following.

(1) Detection of the boundary between the length designation part 2 and the value designation part 3 of the exponent part:

In FIG. 3, the data 100 according to the present expression method is input to the boundary detection circuit 20.

This boundary detection circuit 20 examines the first inverted bit position with reference to the first bit of the length description part (i.e., the L field 2 (as shown in FIG. 1) of the exponent to output the examined position as the result. This refers to the output of the position of the first bit of the E field 3 in the general format of the present expression method shown in FIG. 1. From this result, the length of the L field in FIG. 1 is determined so that the last bit position of the E field of the exponent part can be determined from Equations (11) and (11').

Figure 4:
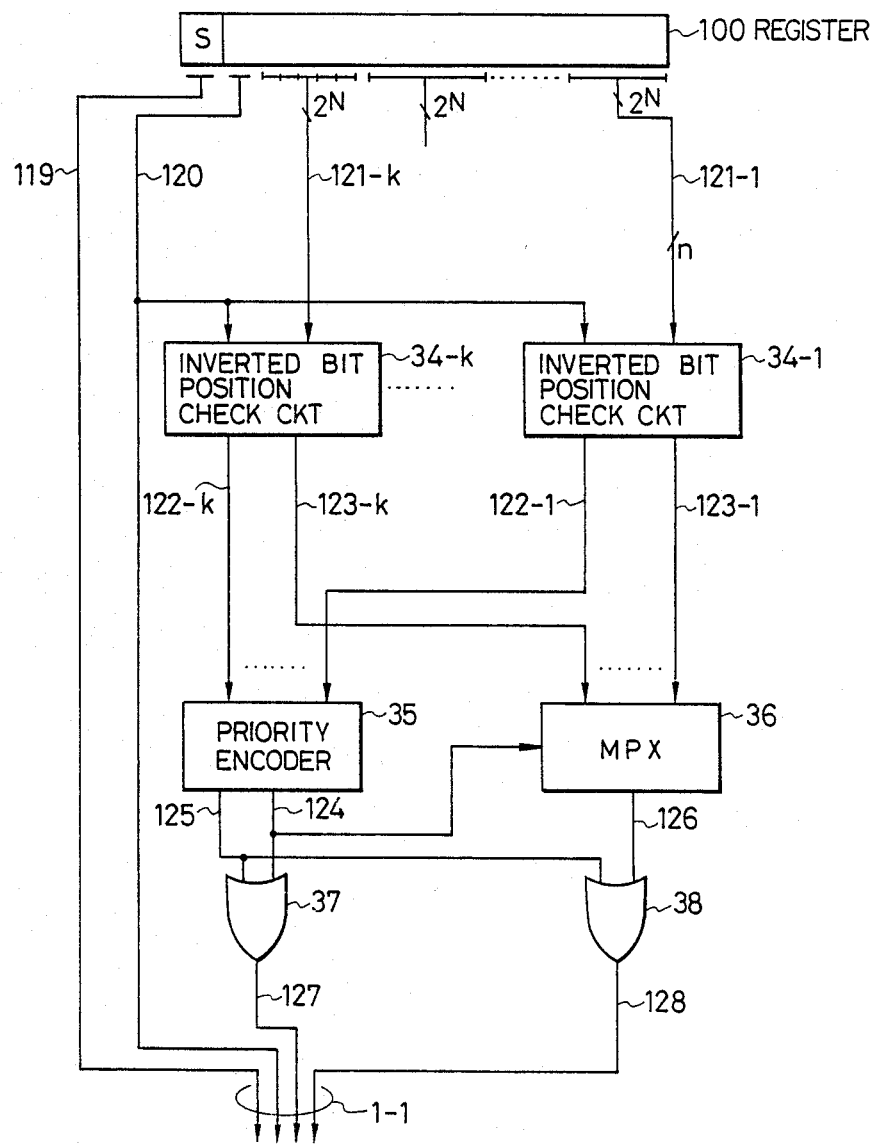
FIG. 4 is a block diagram showing a boundary recognition circuit (20) of FIG. 3.

Next, the operations of the boundary detection circuit 20 will be described in detail with reference to FIG. 4. FIG. 4 is a block diagram showing the boundary detection circuit 20 of FIG. 3. In FIG. 4, reference numerals 34-1, - - -, and 34-k indicate inverted bit position check circuits, respectively; numeral 35 designates a priority encoder; numeral 36 indicates a multiplexer; and numerals 37 and 38 designate OR circuits. The data according to the present expression method is divided for use into a sign bit 119 of the mantissa part; a first bit 120 of the length description part 2 of the succeeding exponent part 5; and succeeding partial bit trains 121-1, - - -, and 121-k. The bits of the data 100 other than the bits 119 and 120 are cut away in order from the tail of the data 100 and are used as the bit trains 121-1, - - -, and 121-k. The first bit 120 is input in common to the right terminal and the partial bit trains 121-k, - - -, and 121-1 are input as partial bit trains to the left terminal of each of the inverted bit position check circuits 34-1, - - -, and 34-k. Each of the inverted bit position check circuits 34-i (i=1 to k) examines the received bit for the presence of a bit at a value different from that of the bit 120 in the partial bit train 121-i with reference to the bit 120 and sets a flag 122-i (i=1 to k) indicating the presence of inversion at "1", if the inverted bit is present, to output the position (which is counted from the last bit in each partial bit train) of the inverted bit closest to the left end of each partial bit train 121-i as the bit serial number 123-i (i=1 to k) of that particular bit. Without inversion, the flag 122-i is set at "0", whereupon the bit serial number 123-i has no meaning. Each partial bit train can be modified so as to have an arbitrary length, but in order to use the hardware efficiently, the length of each partial bit train may be $2^N$, whereupon the number of total input bits to the inverted bit position check circuit 34-i is $2^N+1$ as a result of the fact that the bit 120 is added thereto. When the length of the bit of the data 100 except the bits 119 and 120 is not k times as large as $2^N$ so that the total number of input bits of the partial bit train 121-k is smaller than $2^N$ bits, a number of addition bits like the bit 120 is further input, with a multitude equal to the difference, to the inverted bit position check circuit 34-k. Thus, all the inverted bit position check circuits 34-1 to 34-k can be constructed of an identical circuit. The outputs of the inverted bit position check circuits 34-k, - - -, and 34-1 for N=2, i.e., when the input bit number is 5 bits, are shown in FIG. 5.

In FIG. 5, the bit number of the partial bit train 121-i is set such that the right end bit number of each partial bit train 121-i takes "0" and successively 1, 2 and 3 in the leftward direction. Moreover, the symbol "X" indicates the assumption of a value which is either "0" or "1". The inverted bit position check circuit 34-i can be realized by an ROM (i.e., Read Only Memory), which uses the input bit train as its address input and in which the output data shown in FIG. 5 is written in the corresponding storage location. That circuit 34-i can also be realized easily by using a PLA (i.e., Programmable Logic Array) or a logic gate element.

The flag 122-i output from each inverted bit position check circuit 34-i is input to the priority encoder 35. At this time, the flag 122-k is associated with the input having the highest priority whereas the flag 122-1 is associated with the input having the lowest priority, so that the priority encoder 35 detects the inverted bit position check circuit (e.g., 34-j), to which the partial bit train containing the first inverted bit with reference to the first bit of the length description (part 2) of the exponent part 5 is input, to output the number (j) of the check circuit as a detection result 124. The inverted bit position 123-i output from each inverted bit position check circuit 34-j is input to the multiplexer 36. This multiplexer 36 selects and outputs the inverted bit number (123-j), which is output from the inverted bit position check circuit (34-j) from the inverted bit position check circuit number j indicated by the output 124 of the priority encoder 35.

In the present expression, no bit inversion is present on and after the first bit of the length description part 2 of the exponent part when the data 100 corresponds to numbers 0 and ∞. Since all the flags 122-1, - - -, and 122-k take the value "0" at this time, this state is detected by the priority encoder 35 to set a flag 125 at "1" so that all the plural bits composing the inverted bit position check number 124 output from the priority encoder 35 and an inverted bit number 126 output from the multiplexer 35 are set at 1.

The input and output relationships of the priority encoder 35 for k=2 in FIG. 4, i.e., in the case of there being two inverted bit position check circuits, are shown in FIG. 6. The inverted bit position check circuit number 124 sets the number of the circuit 34-2 at "1" and the number of the circuit 34-1 at "0". The priority encoder 35 can be realized by a ROM which uses the plural flag inputs 122-1 and 122-2 as its address inputs and in which the output data shown in FIG. 6 is written in the corresponding locations. The priority encoder 35 can also be realized easily by a PLA or logic gates. This modification can also be applied in an absolutely identical manner to the case in which the number k is more than 2.

The OR gates 37 and 38 have outputs 127 and 128 which represent the boundary detection result 101 together with the sign bit of the mantissa part and the leading bit 120 of the exponent length description part 2.

Figure 7:
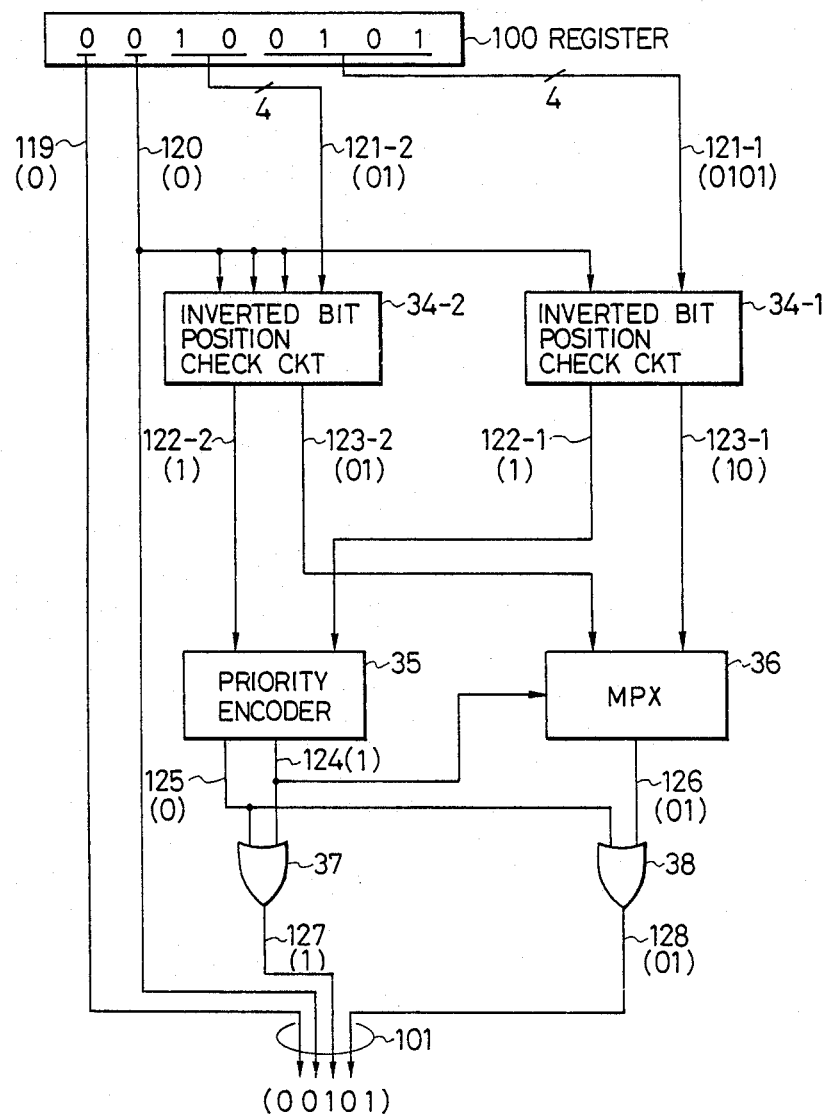
FIG. 7 is a block diagram showing the circuit construction of FIG. 4 for k=2 and the specific data flow therein.

FIG. 7 shows the circuit construction of the boundary detection circuit 20 for k=2 in FIG. 4 and when the input of the partial bit train check circuit is 5 bits and the flow of the data when the 8-bit data "0 0 1 0 0 1 0 1" according to the present expression is to be detected. The parenthesized values indicate the data on the signal lines. Incidentally, since the partial bit train input 121-2 to the inverted bit position check circuit 34-2 is only 2 bits, the lefthand 3 bits input to the circuit 34-2 are bits each identical to the first bit 120 of the exponent length description portion. As a result, the inverted bit position check circuits 34-1 and 34-2 can be made to have an identical construction.

FIG. 8 shows the boundary detection result obtained by the circuit of FIG. 4 for the various 8-bit data 100 according to the present expression. Symbol "X" indicates a value which may be taken as "0" or "1".

As has been described hereinbefore, the outputs 101 express the first inverted bit position with respect to the first bit 120 of the length description part 2 of the exponent part in terms of the serial number of the inverted bit position check circuit, to which the first inverted partial bit train is input, and the inverted bit position in said partial bit train. In other words, the outputs 101 indicate the bit serial number n, which is counted from the trailing bit of the data 100 to a bit having a value inverted from that of the leading bit 120 of the E part. If the length of the data 100 is designated at l, then the length (m+1) of the L part 2 can be derived easily from the relationship $M+1=l-(n+1)$. The length of the exponent part 5 according to the present expression is expressed by $(2m+1)$ from Equations (11) and (11') if the length of the length description part 2 of the exponent part is assumed to be $(m+1)$. Since the value m is determined from the aforementioned value n, the boundary between the exponent part and the mantissa part can be easily detected from the output of the present circuit. The outputs 101 of the present circuit further contain the sign bit 119 of the mantissa part and the first bit 120 of the length description part 2 of the exponent and can discriminate a special number such as 0 or ∞, because it is possible to detect the case in which no inversion of the bit after the first bit of the length description part 2 of the exponent is present, as has been described hereinbefore.

(2) Separation of the exponent part and the mantissa part:

If the data has a short exponent part, it will contain an exponent part and a mantissa part. If the exponent part is long, on the other hand, neither the mantissa part nor the lowest bit or bits of the exponent part will be contained in the data 100. In order to separate the exponent part from the mantissa part, different processings are required in dependence upon which of the two above-mentioned cases the data 100 belongs to.

More specifically, the shift circuit 22 is shifted rightward by the length of the mantissa part in accordance with the output of the boundary detection circuit 20, in case the mantissa part is present, but leftward to give the exponent part a desired length, in case the mantissa part is absent, so that the final bit of the exponent part may be arranged at the right-hand end of the data. For this purpose, the shift circuit 22 has a circuit incorporated therein for determining the direction and stroke of the shift in the following manner.

If the length description part 2 of the exponent part has a length of $(m+1)$ (which is equal to $l-(n+1)$, as has been described above), the length to be owned by the part (i.e., the E field) indicating the size of the exponent part 5 takes the value m, as has been described hereinbefore. The following inequality holds in case the data according to the present expression has a length of l bits:

$$l > 2m+2,$$

i.e., $2m+2 > l,$ then the data 100 contains all the m bits of that size designation part 3 so that the mantissa part is present in the data 100. In this case, the shifting direction is to the right, and the shifting stroke is $l-2m-2$, i.e., $2n+2-l$ bits, which are necessary for shifting out the mantissa part 4. At this time, the value "0" is shifted into the leading part of the data.

Figure 9A:
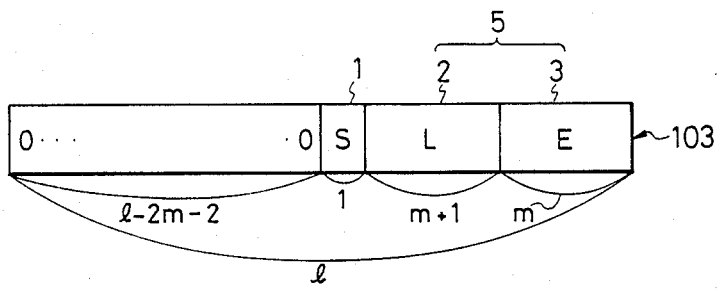
FIGS. 9A and 9B are diagrams showing the exponent part data after having been shifted to the right and left, respectively, by a shift circuit (22) of FIG. 3.

FIG. 9A shows an example of the data 103 after shifted. If the following inequality holds:

$$l \leq 2m+2,$$

i.e., $2n+2 \leq l,$ the bit length of the size designating part 3 of the exponent part in the data 100 is $l-m-2$, which is equal to or smaller than m, then it becomes necessary to compensate the value "0" of the bit number $((2m+2-l)$ bits), which becomes short for reproducing the exponent part of the expression of fixed length. Therefore, a leftward shift is conducted by $(2m-2)-1$, i.e., $1-2n-2$.

Figure 9B:
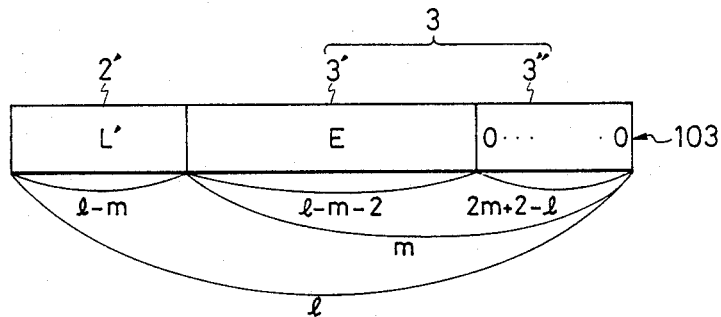

At this time, the value "0" is shifted in. The results 103 of the leftward shift are shown in FIG. 9B. Reference numeral 2' appearing in FIG. 9B indicates that it is composed of data L' after the length description part 2 of the exponent is partially shifted out. The exponent part 3 is composed of a part 3' of the original exponent part E and a "0" train 3''.

The mantissa sign bit 119 output from the boundary detection circuit 20 and the first bit 120 of the exponent length description part 2 have no relationship with the above-specified determinations of the shifting direction and stroke.

Figure 9C:
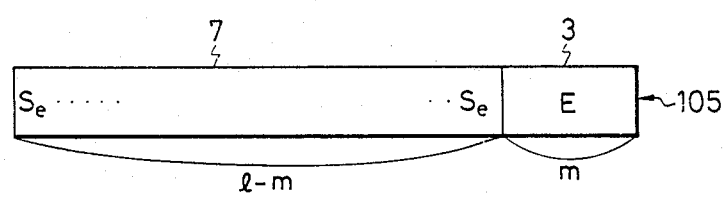
FIG. 9C is a diagram showing the general format of the output of an exclusive OR circuit (23) of FIG. 3.

Next, the data 103 output from the shift circuit 22 and containing the separated exponent part of variable length is transformed into the exponent part data of fixed length. This process (which will be shortly referred to as the "restoration of the exponent part") will be described in the following. The restoration of the exponent part is conducted by generating the bit pattern from the bit pattern generator 21 in accordance with the output of the boundary detection circuit 20 and by transforming the $(l-m)$ bits other than the exponent part 3 (as shown in FIGS. 9A or 9B) of the output 101 of the shift circuit 22 into an exponent sign bit Se by the use of the exclusive OR circuit (i.e., EOR circuit) 23. FIG. 9C shows the general format of the data which is output as the restored exponent part to the EOR 30. As has been described hereinbefore, the length of the exponent part 3 of the output 101 of the shift circuit 22 can be determined from the output of the boundary detection circuit 20, and it is also possible to determine which pattern of FIGS. 9A and 9B the output 101 belongs to. It is further possible to know the exponent part sign bit (S) 1 from the sign bit 119 of the mantissa part, which is contained in the output 110 of the boundary detection circuit 20, and the value of each bit of the L part 2 (FIG. 9A) or 2' (FIG. 9B) from the first bit 120 of the length description part of the exponent part. It is further possible to determine the sign bit Se of the exponent part from Equations (11) and (11') on the basis of the sign bit 119 of the mantissa part and the first bit 120 of the L part. Thus, it is possible to determine the bit pattern to be generated for the restoration of the exponent part from the output 103 of the shift circuit 22 by the use of the EOR circuit 23.

FIGS. 10A to 10D show the output 103 of the shift circuit 22, the output 102 of the bit pattern generator 21, and the output 105 of the EOR circuit 23 in case the output 103 of the shift circuit 22 takes the format shown in FIG. 9A.

FIG. 10A shows the case in which the mantissa part and the exponent part of the data 100 are positive. In other words, the sign bit 119 (shown in FIG. 4) of the mantissa part is at "0", whereas the leading bit 120 (shown in FIG. 4) of the length designation part of the exponent part is at "1". At this time, the output 105 of the EOR circuit 23 to be output as the exponent after the restoratono should be that shown in FIG. 10A, as is understood from the first equation of Equation (10). Of the outputs of the shift circuit 22, therefore, the leading bit of the exponent part 3 and all bits of the length designation part 2 have to be inverted. For this purpose, the bit pattern generator 21 produces the output 102 which has the value "1" only in the position corresponding to those bits as shown in FIG. 10A. The position in which the value "1" is to be generated is the m-th bit counted from the lowest bit of the data 103 to the $(2m+1)$th bit, as seen from FIG. 10A, i.e., from the $(l-n-2)$th bit to the $(2l-2n-3)$th bit, as expressed with respect to the inverted bit position n output from the boundary detection circuit 20.

FIG. 10B shows the case in which the exponent of the data 100 is positive whereas the mantissa of the same is negative, i.e., in case the sign bit 119 of the mantissa part is at "0" whereas the leading bit 120 of the length designation part of the exponent part is at "0". At this time, the output 103 of the shift circuit 22 should take the value shown in FIG. 10B, as is apparent from the second equation of Equation (11), and the output 105 of the EOR circuit 23 should take the value shown in FIG. 10B, as is apparent from the second equation of Equation (10). It follows that the output 102 of the bit patterns generator 21 should have all its leading $(l-m+1)$ bits taking the value "1", as is shown in FIG. 10B.

Likewise, FIG. 10C shows the output 102 of the bit pattern generator 21 in case the mantissa and exponent of the data 100 are negative, and FIG. 10D shows the output 102 in case both the mantissa and exponent of the data 100 are negative.

FIGS. 10E to 10H show the output 103 of the shift circuit 22 and the output 102 (i.e., the output of the EOR circuit 23) of the bit pattern generator 21 in case the output 103 of the shift circuit 22 takes the format of FIG. 9B.

FIGS. 10E to 10H are similar to FIGS. 10a to 10D, respectively, in connection with the sign bits of the mantissa and exponent of the data 100. In the case of FIG. 10E, for example, as is apparent from the first equation ot Equation (11), the output 103 of the shift circuit 22 has its lower $(2m+2-1)$ bits at "0", and its upper $(l-m-2)$ bits at the significant bit parts 0, $e_{m-1}$ and $-e_1$, and its far upper $(l-m)$ bits at "1" so that the output 105 of the EOR circuit 23 takes the format shown in FIG. 10E, as is apparent from the first equation of Equation (10). As a result, the output 101 of the bit pattern generator 21 has to have its leading $(l-m+1)$ bit taking the value "1" as shown in FIG. 10E.

As is apparent from the description thus far made, the bit pattern generator 21 can make outputs having the value "1" in predetermined positions in accordance with the output of the boundary detection circuit 20 thereby to generate the exponent data 105 expressed to have the fixed length from the output of the shift circuit 22 by the EOR circuit 23.

The bit pattern generator 21 can be realized easily by using a ROM which is connected to receive the output of the boundary detection circuit 20 as its address input and which stores the bit patterns shown in FIGS. 10a to 10H in the corresponding storage locations. The bit pattern generator 21 can also be realized easily by using a PLA or a logic circuit.

Figure 11A:
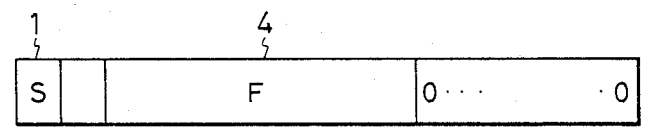
FIG. 11A is a diagram showing the format of the mantissa part data after having been shifted by a shift circuit (24) of FIG. 3.
Figure 11B:
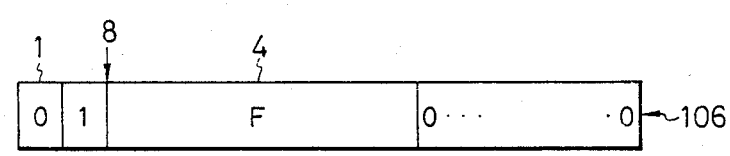
FIGS. 11B and 11C are diagrams showing different examples of the output of a bit insertion circuit (25) of FIG. 3, respectively.
Figure 11C:
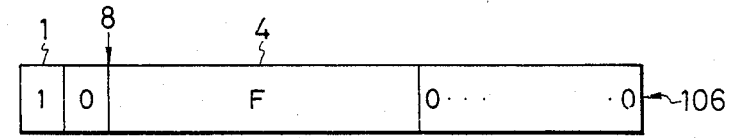

(ii) Separation of the mantissa part:

The shift circuit 24 shifts the data 100 according to the present expression leftward in accordance with the output of the boundary detection circuit 21, while maintaining the sign bit of the mantissa part, such that the boundary between the exponent part and the mantissa part is located between the second and third bits from the left end. If the length of the length description part 2 of the exponent of the data 100 is set at $(m+1)$, the length of the exponent part is expressed by $(2m+1)$ so that the shifting stroke is $2m$ bits. The shift cirucit 24 is equipped with a circuit for detecting that shifting stroke 2m in response to the output of the boundary detection circuit 20. In accordance with the shifting operation, the value "0" is shifted in at the lower bits of the data. The shift result is shown in FIG. 11A. In FIG. 11A, reference numeral 1 indicates the sign bit of the mantissa part, and the succeeding bits are the lowest bits of the exponent part. Next, the bits at the lefthand of the point of the mantissa part omitted as redundant bits are inserted by the bit insertion circuit 25. This bit insertion is conducted by inverting the sign bit of the mantissa part and by replacing one bit succeeding the sign bit of the mantissa by the inverted sign bit. In other words, the one bit succeeding the sign bit of the mantissa is set at "0" for the sign bit "1" and at "1" for the sign bit "0". The results of the respective cases ar shown in FIGS. 11B and 11C. The decimal point is located at a point 8.

(3) Arithmetic Processing:

The exponent part 105 and the mantissa part 106 after being separated are processed in the arithmetic unit 26 with the exponent part 107 and the mantissa part 108 of another number separated by similar means (not shown), and the exponent part of the processed result after being normalized to locate the mantissa within the range of Equations (3) and (3') is output to 100', whereas the mantissa part of the same is output to 110.

Figure 12A:
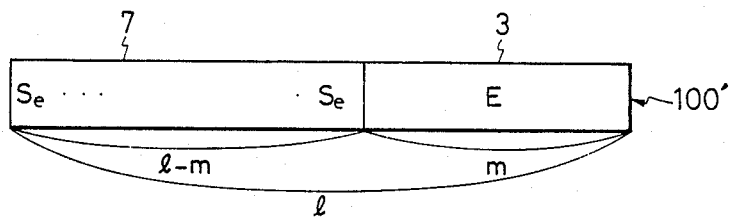
FIG. 12A is a diagram showing the format of the exponent data output (100') of a processing unit (26) of FIG. 3.

(4) Detection between the sign bit part and the significant bit part of the exponent part:

The data format of the exponent part data 100' is shown in FIG. 12A. Reference numeral 7 indicates the exponent sign bit part (Se) which is composed of the "0" train or "1" train in dependence upon whether the exponent is positive or negative, and numeral 3 indicates the part composed of the significant bits (E) of the exponent. In case this exponent is expressed by m bits, the significant bit part 3 is composed of the m bits and has its leading bit at a value different from that of the sign bit Se so that it is expressed by the Equation (10). In order to know the length of the significant bit part 3, i.e., the number of the significant bits, it is sufficient to examine the bit inversion consecutively in the rightward direction with reference to the sign bit 7 and to detect the bit position in which the bit is first inverted. Since this bit is the leading bit of the significant bit part 3, the length of the succeeding bits including it represents the length of the significant exponent parts 3.

Figure 13:
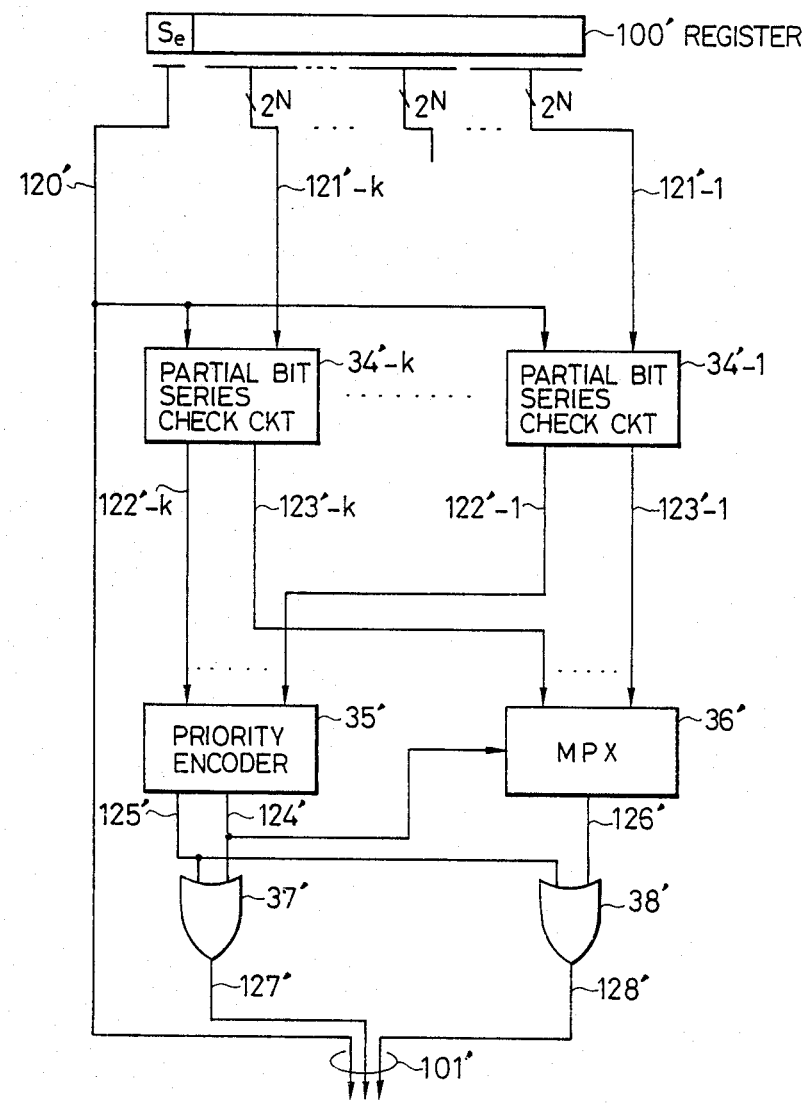
FIG. 13 is a block diagram showing a circuit for detecting the boundary between the sign bit part and significant bit part of the exponent part of FIG. 3.

FIG. 13 is a block diagram showing the boundary detection circuit 27 for detecting the boundary between the sign bit part and the significant bit part. Reference numerals 34'−1 to 34'−k indicate respective bit position check circuits; numeral 35' identifies a priority encoder; numeral 36' designates a multiplexer; and numerals 37' and 38' identify logic OR circuits.

In FIG. 13, the exponent part 100' is used as the sign bit 120' and the partial bit trains 121'−1, - - -, and 121'−k succeeding the former are separated. The respective inverted bit position check circuits 34'−1, - - -, and 34−k receive in common at their left terminals the sign bit 120' and receive at their right terminals respecitvely the partial bit trains 131−1, - - -, and 139−k. Each inverted bit position check circuit 34'−i (i=1 to k) looks for the presence of a bit inversion with respect to the sign bit 120' and sets the flag 122'−1, which indicates the presence of an inversion, at "1" if the inversion is present, to output the position of the first bit inverted, as viewed from the sign bit 120', as the number 123'−i of that bit. In the absence of an inversion, the flag 122'−i is set at "0", whereupon the bit number 123'−i has no meaning. The construction of the inverted bit position check circuit 34'−i is basically the same as that of the inverted bit position check circuit 34−i of FIG. 4, and its input and output relationships are indicated by the primed reference numerals of the signals shown in FIG. 5. Likewise, the priority encoder 35' and multiplexer 36' and their respective constructions and outputs 125', 124' and 126', and the OR gates 37' and 38' and their respective outputs 127' and 128' have the same meanings as those of the circuits or signals of the reference numerals which are not primed in FIG. 4.

Figure 14:
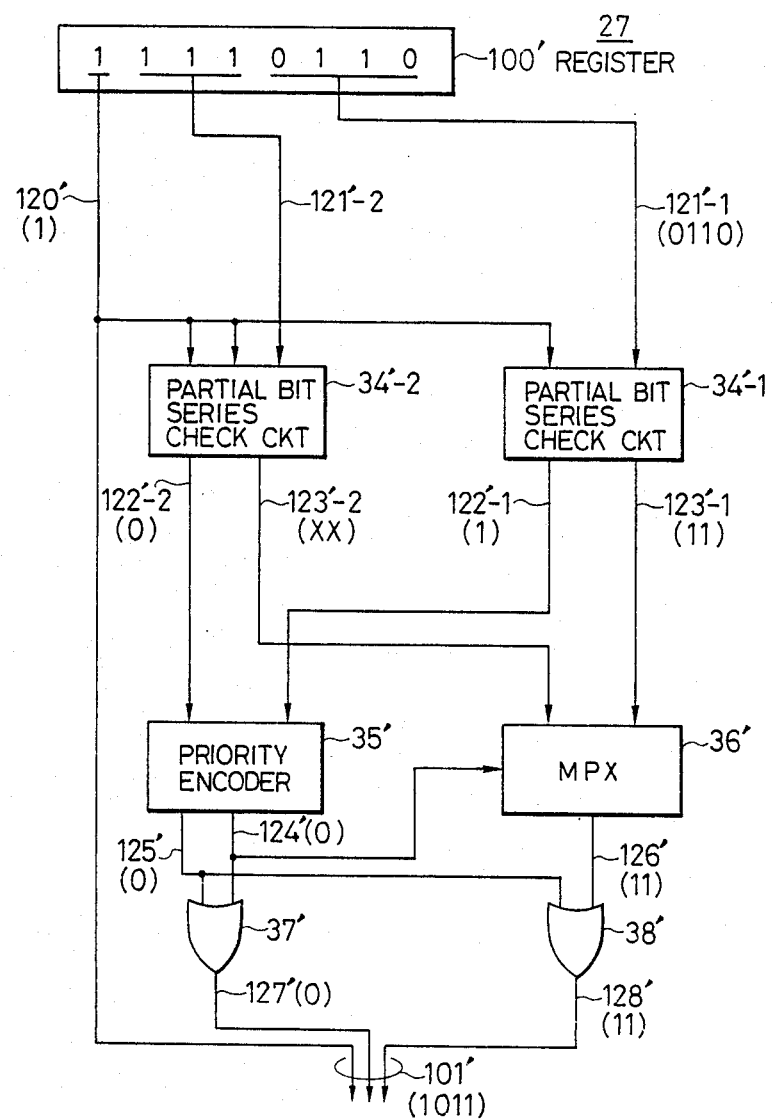
FIG. 14 is a block diagram showing a specific embodiment of FIG. 13 and the internal data of the same.

On the other hand, FIG. 14 shows the construction of the boundary detecting circuit 27, for k=2 in FIG. 13 and when the inverted bit position check circuit 34'−i has a 5-bit input, and the flow of the data for the exponent 1 1 1 1 0 1 1 0 is detected. The parenthesized values designate the data on the signal lines. The circuit construction itself is completely the same as that of FIG. 7 except for the signal line 119, and the circuits or the signal lines of FIG. 14 correspond to the circuits or signal lines of FIG. 7 having the reference numerals from which the primes are eliminated.

As has been apparent from the description thus far provided, the relationship between the input 100' and the output 101' of the boundary detection circuit 27 is obtained in the same manner as the circuit of FIG. 8, except for the output 119. As a result, the output 101' is constructed such that its significant exponent part 3 has its leading bit position composed of the signals 127 and 128, which are indicated by n' counted from the trailing bit of the data 100' and the part 120' indicating the exponent sign bit. If the total bit length of the data 100' is indicated by l, the significant bit part 3 has a length equal to n'.

Figure 12B:
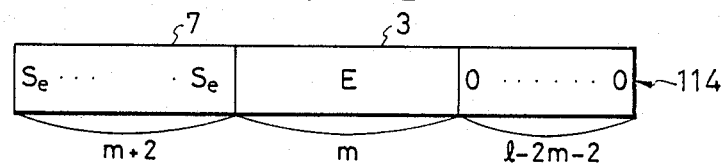
FIGS. 12B and 12C are diagrams showing the different output formats of a shift circuit (29) of FIG. 3.

(5) Combination of the exponent part and the mantissa part:

The exponent part 101' is shifted by the shift circuit 29. At this time, the shifting direction and stroke are so determined that the significant bit part 3 comes to the position to be taken by the leading bit of the significant bit 3 of the exponent part 100' when the exponent part 100' and the mantissa part 110 are combined and transformed into the present expression type. The shifting direction and stroke can be determined specifically in the following manner. If the total length of the exponent is assumed to be l bits, whereas the length of the significant bit part 3 is assumed to be m bits, as shown in FIG. 12A, then the length of the exponent length description part when transformed into the present expression type has (m+1) bits from Equations (11) and (11') so that the first bit of the significant bit part in FIG. 12A has to be located at the (m+3)th bit when transformed into the present expression type. Hence, if the following inequality holds:

$$l-m+1 > m+3$$

i.e., $l-2m-2 > 0$, the shifting direction is leftward, and the shifting stroke is (l−2m−2) bits. In the leftward shift, the value "0" is shifted at the right end. The output 114 after this leftward shift is shown in FIG. 12B. If the following inequality holds:

$$l-2m-2 \leq 0,$$

the shifting direction is rightward, and the shifting stroke is (2m−1+2) bits. In the rightward shift, the sign bit Se is shifted in at the right end. The result of this rightward shift is shown in FIG. 12C.

As has been described hereinbefore, the output of the boundary detection circuit 27 indicates the position of the leading bit of the significant bit part 3, which is counted from the right end of the exponent part 100′, i.e., the significant bit number m of the exponent. The shift circuit 27 includes a circuit for determining the shifting direction and a shift bit number on the basis of that number m in connection with a predetermined value 1 from the above-specified computing equation.

Next, the procedures for generating the exponent part of the present expression type from the shift result will be described in the following. The exponent part according to the present expression method is generated by generating the bit pattern 112 from the output 101′ of the exponent boundary detection circuit 27 and the sign bit of the mantissa by the bit pattern generator 28 and by transforming the sign bit part 7 and the significant bit part 3 of FIGS. 12B and 12C by the use of the EOR circuit 30 in accordance with Equations (11) and (11′). The position and length of the exponent significant bit part 3 and the sign bit part 7 of the exponent of FIGS. 12B and 12C are determined from the output 101′ of the exponent part boundary detection circuit 27. Based upon the sign bit of the mantissa 110, it is possible to generate the bit pattern necessary for generating the exponent part of variable length according to the present expression.

Figure 12C:
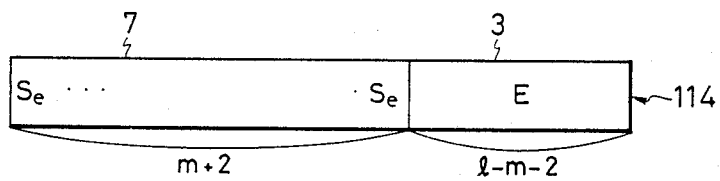
Figure 12D:
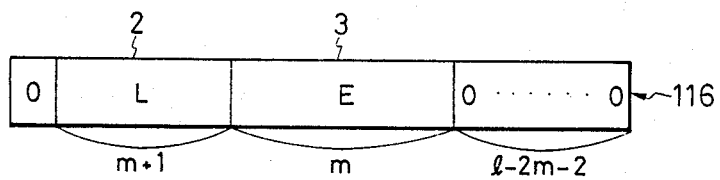
FIG. 12D shows the general format of the result of the exponent part generated for the shift output in the case of FIG. 12B.
Figure 12E:
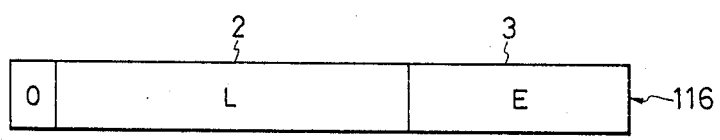
FIG. 12E shows the general format of the result of the exponent part generated for the shift output in the case of FIG. 12C.

FIG. 12D shows the general format of the result of the exponent part (i.e., the output 116 of the EOR circuit 30) generated for the shift output 114 in the case of FIG. 12B, and FIG. 12E shows the general format of the result (i.e., the output 116 of the EOR circuit 30) of the exponent part generated for the shift output 114 in the case of FIG. 12C. In either case, the left end bit of the output is set at "0", and the OR circuit 33 is used so that the sign bit of the mantissa data 110 can be inserted.

FIGS. 15A to 15D show the various outputs 112 of the bit pattern generator 28 in case the output of the shift circuit 29 takes the format of FIG. 12B.

FIG. 15A shows the pattern in case both the mantissa part 110 and the exponent part 100′ are positive. Whether the mantissa 110 is positive or not can be judged in dependence upon whether its leading bit is at "0" or not, and whether the exponent part 100′ is positive or not can be judged in view of the exponent sign bit (i.e., 120′ of FIG. 13) in the output 101′ of the boundary detection circuit 27. At this time, the output 114 of the shift circuit 29 has significant bits at the m bits on and after the (m+3)th bit from the leading bit, as shown in FIG. 15A. As is apparent from the first equation of Equation (11), on the other hand, the signal 116 to be output as the data for the exponent data 114 according to the present expression from the EOR circuit 390 takes the value "1" from the second bit to the (m+2)th bit, the value "0" at the next (m+3)th bit, and the significant bit part of (m−1) bits and a train of "0" of (l−2m−2) bits at the subsequent bits. This last part is that to which the mantissa is to be added. Therefore, the output 112 of the bit pattern generator 28 has to be the pattern which takes the value "1" for the (m+1) bits 10 from the second bit to the (m+3)th bits, as shown in FIG. 15A.

FIG. 15B shows the case in which the mantissa is positive whereas the exponent is negative; FIG. 15C shows the case in which the mantissa is negative whereas the exponent is positive; and FIG. 15D shows the case in which both the mantissa and the exponent are negative. The description of these cases are omitted here because they are apparent from Equations (11) and (11′).

FIGS. 15E to 15H correspond to the case in which the output 114 of the shift circuit 29 is shown in FIG. 12C, and the values of the sign bits of the mantissa and exponent correspond to FIGS. 15A to 15D, respectively.

The bit pattern generator 28 can be realized easily by the use of a ROM which is connected to receive the output 101′ of the boundary detection circuit 27 and the sign bit of the mantissa 110 as its address inputs and in which is stored the bit pattern shown in FIGS. 15A to 15H in its corresponding storage locations. The bit pattern generator 28 can also be realized easily by the use of a PLA and logic gates. Incidentally, the bit pattern generator 28 outputs another bit pattern 113, which will be described hereinafter.

The mantissa 110 is shifted rightward up to a predetermined position of the mantissa of the present expression type, while expanding the sign bit Se rightward, by the shift circuit 31 in accordance with the outputs 127′ and 128′ in the output 101′ of the boundary detection circuit 27.

Figure 16A:
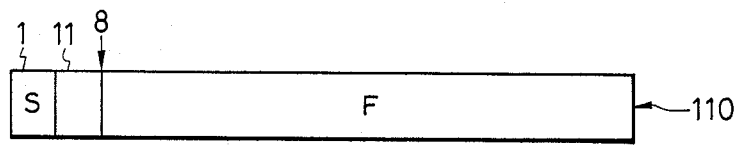
FIG. 16A is a diagram showing the format of the output mantissa data (110) of the processing unit (26) of FIG. 3.
Figure 16B:
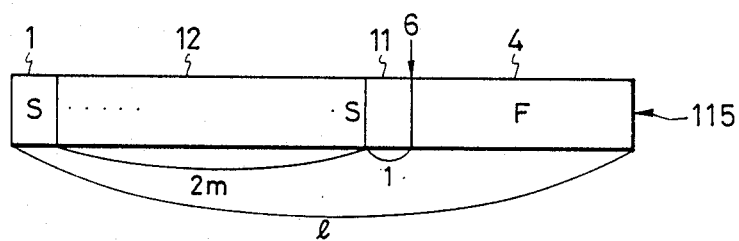
FIG. 16B is a diagram showing the output format of a shift circuit (31)
Figure 16C:
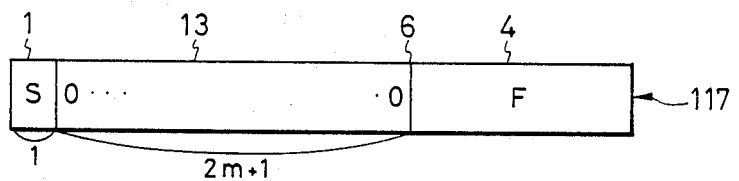
FIG. 16C is a diagram showing the output format of an AND circuit (32) of FIG. 3.
Figure 16D:
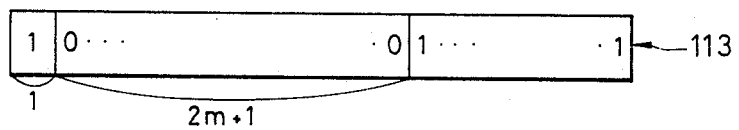
FIG. 16D is a diagram showing the format of another output bit pattern (113) of the bit pattern generator (28) of FIG. 3.

The shifting stroke is 2m bits when the length of the exponent part is (2m+1) bits. FIG. 16A shows the normalized mantissa part data 110 before it is shifted. Reference numeral 1 indicates the mantissa sign bit, and numeral 11 is identical to the inversion of the mantissa sign bit in accordance with Equation (3) and its definition. The decimal point is located at 8. FIG. 16B shows the result of the output which is shifted rightward by 2m bits. Numeral 12 indicates a 2m number of mantissa sign bits, and the decimal point is at 6, which provides the boundary between the exponent part and the mantissa part according to the present expression. Next, in order to set the region stored with the exponent part at "0", the bit pattern 113 is generated by the bit pattern generator 28, and a logical product is taken between the bit pattern 113 and the output 115 of the shift circuit 31 by the AND circuit 32. The resultant output 117 is shown in FIG. 16C. The pattern 113 generated by the bit pattern generator 28 is made, as shown in FIG. 16D, such that all (2m+1) bits corresponding to 12 and 11 in FIG. 16B are at "0" whereas all the bits corresponding to the other parts are at "1". Therefore, the bit pattern generator 28 is constructed to generate bit pattern 113 separately of the bit pattern 112 in accordance with the value m which is expressed by the output 101′ of the boundary detection circuit 27.

The result 118 transformed into the present expression is attained if the logical sum of the exponent part 116 output from the EOR circuit 30 and the mantissa part 117 output from the AND circuit 32 is taken by the use of the OR circuit 33. This resultant output 118 is equal to the output 116 of the EOR circuit 30 in case the output 116 of the EOR circuit 30 is shown in FIGS. 15E to 15H. The same result is obtained as the output 101 of the circuit 20 even if, in place of the left end input bit 120 of the check circuits 34-(k-1), - - -, and 34-1, the right end bit of the lefthand partial bit train is input. Similar processing applies to the circuits 34′-1 to 34′-k of FIG. 13.

As has been described hereinbefore, according to the present invention, the separation of the exponent part and the mantissa part from the data according to the floating-point expression having an exponent part of variable length, and the combination of the exponent part of fixed length and the mantissa part after the arithmetic operation into floating point data with an exponent part of a variable length are conducted in bit-parallel so that a high-speed floating-point data processing apparatus can be realized.

What is claimed is:

1. A floating-point data processing apparatus for generating exponent data of fixed length from floating-point data composed of (a) a sign bit indicating a mantissa sign, (b) a first exponent part which has a bit length determined in dependence upon a significant bit length necessary for binary expression of an exponent and which has all its bits determined at 1 or 0 in dependence upon said mantissa sign and the sign of said exponent, (c) a second exponent part which has its bit length determined in dependence upon the bit length of said first exponent part, which has a predetermined relationship determined in dependence upon the sign of said exponent and said mantissa sign with the significant bit part when said exponent is expressed in binary form, and the leading bit of which has a value different from the value of one bit of said first exponent part, (d) and a mantissa part which has a plurality of bits having a bit length determined in dependence upon the value of said exponent; said exponent data of fixed length being composed of a sign bit part having a plurality of bits having values indicating the sign of said exponent, and a significant bit part having a plurality of bits indicating the values of said exponent, said apparatus comprising:

detection means connected to receive in parallel a plurality of bits other than said sign bit of said floating-point data for detecting the position of a bit, which has a value different from the value of one bit of said first exponent part and which is the closest to said first exponent part, as the position of the leading bit of said second exponent part;

shift means connected to receive in parallel at least bits other than said sign bit of said floating-point data and responsive to the position detected by said detecting means for shifting said first floating-point data such that said second exponent part comes to a predetermined position;

signal means for generating a bit pattern signal comprised of bits indicating a bit position of said shifted first floating-point data, said bit position being determined in dependence upon said sign bit of said floating-point data, the leading bit of said first exponent part and said position detected by said detecting means; and output means connected to receive in parallel the respective bits of said first floating-point data shifted by said shift means and responsive to said generated bit pattern signal for generating said exponent data by transforming values of bits in said shifted first floating-point data which bits are indicated by said generated bit pattern signal.

2. A floating-point data processing apparatus according to claim 1, wherein said output means includes a plurality of exclusive OR circuits each connected to receive one bit of said floating-point data and one bit of said bit pattern.

3. A floating-point data processing apparatus for generating mantissa data of fixed length from the floating-point data composed of (a) a sign bit indicating a mantissa sign, (b) a first exponent part which has a bit length determined in dependence upon a significant bit length necessary for binary expression of an exponent and which has all its bits determined at 1 or 0 in dependence upon said mantissa sign and the sign of said exponent, (c) a second exponent part which has its bit length determined in dependence upon the bit length of said first exponent part, which has a predetermined relationship determined in dependence upon the sign of said exponent and said mantissa sign with the significant bit part when said exponent is expressed in binary form, and the leading bit of which has a value different from the value of one bit of said first exponent part, and (d) a mantissa part which has a plurality of bits having a bit length determined in dependence upon the value of said exponent; said mantissa data of fixed length being composed of a sign bit part indicating said mantissa sign, an inverted bit part inverted from said sign bit part, and a significant bit part indicating the magnitude of said mantissa data, said apparatus comprising:

detection means for receiving in parallel a plurality of bits of said floating-point data and for detecting the position of the bit which has a value different from the value of one bit of said first exponent part and which is the closest to said first exponent parts, as the position of the leading bit of said second exponent part;

shift means connected to receive in parallel a plurality of bits of said floating-point data and for shifting the bits other than said sign bits of said floating-point data in accordance with said position detected by said detection means such that the leading bit of said mantissa part comes to a position which is next but one to said sign bit; and output means for inserting the inverted bit of said sign bit into the position next to said sign bit of said floating-point data output from said shift means to output the inserted data as said mantissa data of fixed length.

4. A floating-point data processing apparatus for generating floating-point data having an exponent part of a variable length from both exponent data of fixed length and mantissa data of fixed length, said exponent data being composed of a sign bit part having a plurality of bits of values determined by an exponent sign and a significant bit part having a plurality of bits indicating the value of said exponent, and said mantissa data of fixed length being composed of a mantissa sign bit part, and a mantissa significance bit part, wherein said floating-point data is composed of (a) a sign bit indicating the mantissa sign, (b) a first exponent part which has a bit length determined in dependence upon a significant bit length necessary for binary expression of said exponent and which has all its bits determined at 1 or 0 in dependence upon said mantissa sign and the sign of said exponent, (c) a second exponent part which has its bit length determined in dependence upon the bit length of said first exponent part, which has a predetermined relationship determined in dependence upon the sign of said exponent and said mantissa sign with the significant bit part when said exponent is expressed in binary form, and the leading bit of which has a value different from the value of one bit of said first exponent part, and (d) a mantissa part which has a plurality of bits having bit length determined in dependence upon the value of said exponent, said apparatus comprising:

detection means for receiving in parallel a plurality of bits of said exponent data and for detecting the position of a bit which has a value different from the value of one bit of said sign bit part and which is the closest to said sign bit part, as the position of the leading bit of said significant bit part of said exponent data;

first shift means connected to receive in parallel a plurality of bits of said exponent data and for shifting said exponent data in dependence upon said detected position such that the leading bit of said exponent data is positioned next to the first exponent part of said floating-point data to be generated;

second shift means connected to receive in parallel a plurality of said mantissa data and for shifting said mantissa data in dependence upon said detected position such that the leading bit of said mantissa data comes next to the significant bit part of the exponent data after being shifted;

signal means for generating a first bit pattern which indicates the bit position of a bit whose value is to be transformed in the exponent data which is shifted by said first shift means, in dependence upon the sign bit part of said exponent data, the sign bit of said mantissa sign bit part or said position detected by said detection means, and for generating a second bit pattern which indicates the position other than the mantissa significant bit part of the mantissa data shifted by said second shift means in dependence upon said position detected by said detection means; and output means connected to receive in parallel both the respective bits of said exponent data and said mantissa data, after being shifted respectively by said first and second shift means, and the respective bits of said first and second bit patterns and for generating said floating-point data.

5. A floating-point data processing apparatus according to claim 4, wherein said output means includes a plurality of exclusive OR gates each for receiving one of said first bit patterns and one bit of said shifted floating-point data.

6. A floating-point data processing apparatus according to claim 5, wherein said output means includes means for masking said shifted mantissa data in accordance with said second bit pattern and an OR circuit for taking the logical sum between the outputs of said plural exclusive OR gates and said masked shifted mantissa data to output the results of the sum as said floating-point data.

* * * * *